United States Patent
Wang et al.

(10) Patent No.: US 9,281,196 B2
(45) Date of Patent: Mar. 8, 2016

(54) METHOD TO REDUCE ETCH VARIATION USING ION IMPLANTATION

(71) Applicant: Taiwan Semiconductor Manufacturing Co., Ltd., Hsin-Chu (TW)

(72) Inventors: Tsan-Chun Wang, Hsinchu (TW); Ziwei Fang, Hsinchu (TW); Chii-Horng Li, Zhubei (TW); Tze-Liang Lee, Hsinchu (TW); Chao-Cheng Chen, Shin-Chu (TW); Syun-Ming Jang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/175,194

(22) Filed: Feb. 7, 2014

(65) Prior Publication Data

US 2015/0187927 A1  Jul. 2, 2015

Related U.S. Application Data (60) Provisional application No. 61/922,149, filed on Dec. 31, 2013.

(51) Int. Cl.
| | |
|---|---|
| *H01L 29/78* | (2006.01) |
| *H01L 21/265* | (2006.01) |
| *H01L 29/66* | (2006.01) |
| *H01L 29/10* | (2006.01) |
| *H01L 29/165* | (2006.01) |
| *H01L 21/8238* | (2006.01) |
| *H01L 21/306* | (2006.01) |
| *H01L 21/3065* | (2006.01) |

(52) U.S. Cl.
CPC ...... *H01L 21/26513* (2013.01); *H01L 21/3065* (2013.01); *H01L 21/30608* (2013.01); *H01L 21/823807* (2013.01); *H01L 21/823892* (2013.01); *H01L 29/1054* (2013.01); *H01L 29/165* (2013.01); *H01L 29/66651* (2013.01)

(58) Field of Classification Search
None
See application file for complete search history.

(56) References Cited

U.S. PATENT DOCUMENTS

| | | | |
|---|---|---|---|
| 5,270,554 A | 12/1993 | Palmour | |
| 2008/0224208 A1* | 9/2008 | Chun | 257/334 |
| 2012/0261754 A1* | 10/2012 | Cheng et al. | 257/347 |
| 2013/0284697 A1* | 10/2013 | England et al. | 216/47 |

OTHER PUBLICATIONS

Berg, et al. "Dry etching of n and ptype polysilicon: Parameters affecting the etch rate." Citation: Journal of Vacuum Science & Technology, A5, 1600, published in 1987. 5 Pages.

(Continued)

*Primary Examiner* — Stanetta Isaac
(74) *Attorney, Agent, or Firm* — Eschweiler & Associates, LLC (57) ABSTRACT

The present disclosure relates to a method of forming a transistor device. In this method, first and second well regions are formed within a semiconductor substrate. The first and second well regions have first and second etch rates, respectively, which are different from one another. Dopants are selectively implanted into the first well region to alter the first etch rate to make the first etch rate substantially equal to the second etch rate. The first, selectively implanted well region and the second well region are etched to form channel recesses having equal recess depths. An epitaxial growth process is performed to form one or more epitaxial layers within the channel recesses.

20 Claims, 7 Drawing Sheets (56) References Cited

OTHER PUBLICATIONS

Li, et al. "Fabrication of a Single Crystalline Silicon Capacitive Lateral Accelerometer Using Micromachining Based on Single Step Plasma Etching." Laboratory of Electronic Instrumentation, Department of Electrical Engineering, Dew Institute of Microelectronics and Submicrontechnology (DIMES). Published in 1995. 6 Pages.

H. Seidel, et al., "Anisotropic Etching of Crystalline Silicon in Alkaline Solutions: II . Influence of Dopants," J. Electrochem. Soc., 1990, vol. 137, No. 11, p. 3626-3632.

* cited by examiner

METHOD TO REDUCE ETCH VARIATION USING ION IMPLANTATION

CROSS REFERENCE TO RELATED APPLICATIONS

This application is a Non-Provisional patent application claiming priority to U.S. Provisional Patent Application Ser. No. 61/922,149 filed on Dec. 31, 2013 entitled "Method to Reduce Etch Variation Using Ion Implantation" in the name of Tsan-Chun Wang, et al. and is incorporated herewith by reference.

FIELD

Modern day integrated circuits comprise millions or billions of transistors. Transistors may be used for amplifying or switching electronic signals and/or to provide functionality to integrated circuits. Transistors may be either n-type transistors or p-type transistors. While transistors may be formed using various techniques and materials, they require accurate and precise placement of their various components and constituents to operate optimally and efficiently, especially as dimensions continue to shrink to meet advanced integration requirements. One such constituent is the dopant impurities that are introduced into the channel region because they directly influence the functionality and performance of the transistor device. The characteristics and location of the dopant impurities (i.e., the dopant profile) must be carefully controlled.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Over the past few decades the semiconductor industry has made continual advances in manufacturing technology (e.g., photolithography), which have allowed for a steady reduction in transistor device size. Decreasing the size of a transistor device while keeping a power density constant improves the performance of the transistor. However, in recent years, as scaling has begun to reach the physical limitations of materials, scaling has begun to cause a number of problems with transistor devices.

One such problem is that as transistor gate lengths continue to decrease, local and global variations of transistor threshold voltages have increased (i.e., worsened). This increase can stem, for example, from any number of separate processing operations that are used to form structural features of transistor devices. One such processing operation is etching, which is used to remove or erode away regions from an integrated chip workpiece at various stages of the manufacturing process. In some cases, it is ideal for an etch to have a uniform vertical etch profile over a large chip area such that the etch can provide one or more recesses which have equal depths (i.e., recesses whose lower surfaces are co-planar). Unfortunately, however, small doping differences in the regions to be removed by the etch can cause corresponding variations in etch rates for these regions and corresponding recess depth variations on the chip. As feature sizes shrink, these recess depth variations can lead to gate structures and/or replacement channels with different heights over the chip. These different gate heights and/or different replacement channel heights can cause slight capacitance variations between transistors, and can also cause issues with residue being more difficult to remove from top surfaces of some gates (e.g., shorter gates). The end result is that traditional processes have variations in transistor performance due to these recess depth variations.

Accordingly, the present disclosure relates to techniques whereby selective ion implantation is used to "tune" etch rates of regions to be etched. In some embodiments, the etch rates can be "tuned" so that uniform etch profiles can be formed over a wafer surface. The improved etch profile uniformity can improve overall device performance by mitigating local and global voltage threshold variations.

Figure 1:
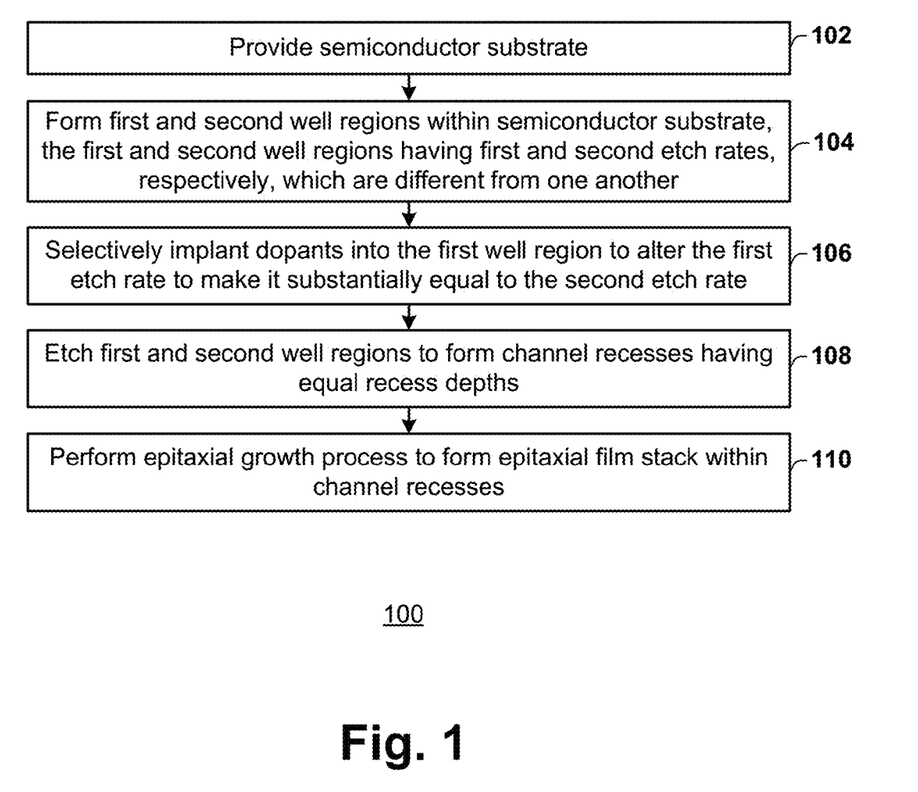
FIG. 1 illustrates a flow diagram of some embodiments of a method of transistor fabrication that uses implantation-assisted etching to improve local and global voltage threshold variations.

FIG. 1 illustrates a flow diagram of some embodiments of a method 100 of implantation-assisted etching configured to augment device performance by improving local and/or global variations of voltage threshold between transistor devices.

At 102, a semiconductor substrate is provided. In an exemplary embodiment, the semiconductor substrate is a bulk silicon substrate. However, the semiconductor substrate may comprise any type of semiconductor body (e.g., silicon, silicon-germanium, silicon-on-insulator), which can include doped regions formed therein and other conductive and/or dielectric regions formed thereover.

At 104, first and second well regions, which have differences in doping, are formed within the semiconductor substrate. The differences in doping can cause the first and second well regions to have different etch rates relative to a predetermined etch process. The differences in doping can manifest themselves in a number of ways. For example, the first well region can be n-type and the second well region can be p-type, or the first and second well regions can both have the same doping type with different dopant concentrations.

To "tune" the etch rates of the first and second well regions, at 106 dopants are selectively implanted into at least one of the well regions to alter its etch rate to make it substantially equal to that of the other well region. For example, in one embodiment, if a first etch rate of the first well region is initially less than a second etch rate of the second well region, dopants can be selectively implanted into the first well region to increase the first etch rate until it equals the second etch rate. Alternatively, dopants could be selectively implanted into the second well region to decrease or retard the second etch rate until it equals the first etch rate. Dopants can also be implanted into the first and second well regions to tune the first and second etch rates (e.g., in different directions) to make the etch rates equal.

At 108, after the etch rates of the first and second well regions have been "tuned" by selective ion implantation, the first and second well regions are concurrently etched to form channel recesses in the first and second well regions by using the predetermined etch process. The recesses formed by this process have the same depth over the first and second well regions. In other words, the recesses formed in the first and second well regions can have lower surfaces that lie on a common plane.

At 110, an epitaxial growth process is performed to form epitaxial film stacks within the channel recesses. An epitaxial film stack comprises one or more epitaxial layers that are formed within the channel recesses. In some embodiments, the epitaxial film stack may comprise silicon. In some embodiments, the epitaxial film stack may comprise a carbon doped epitaxial layer and an un-doped epitaxial layer. The carbon doped epitaxial layer may be epitaxially grown onto a bottom surface of the recess at a position overlying the silicon carbon implantation region. The un-doped epitaxial layer may be epitaxially grown onto the carbon doped epitaxial layer.

This "implant tuned" etch procedure and subsequent epitaxial growth is advantageous over traditional methods. By tuning the etch rates of the first and/or second well regions by ion implantation, the method of FIG. 1 reduces variations in recess depths, and thereby provides epitaxial films with more uniform heights. This more uniform height provides more uniform transistor operation performance than previously achievable. For example, these techniques can provide more uniform threshold voltages for transistors over a wafer, as well as providing improved device speeds for typical transistors on the wafer. Further, compared to conventional replacement channel approaches where a capacitance variation over transistors on a wafer can be in the range of 30-60%, some embodiments of the present disclosure can reduce this capacitance variation to less than 10% over the transistors on the wafer.

Figure 2A:
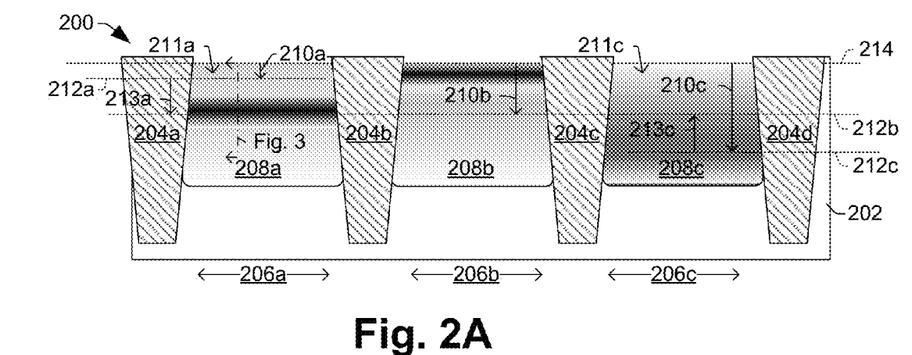
FIGS. 2A-2C illustrate some embodiments method of transistor fabrication that uses implantation-assisted etching to improve local and global voltage threshold variations.
Figure 2B:
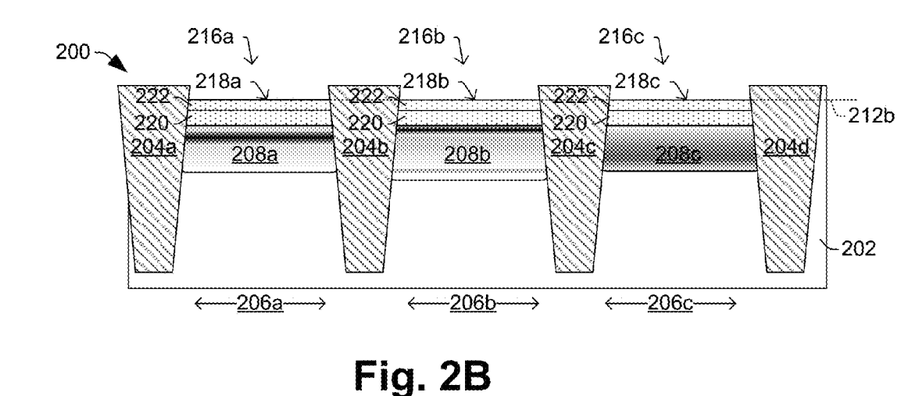
Figure 2C:
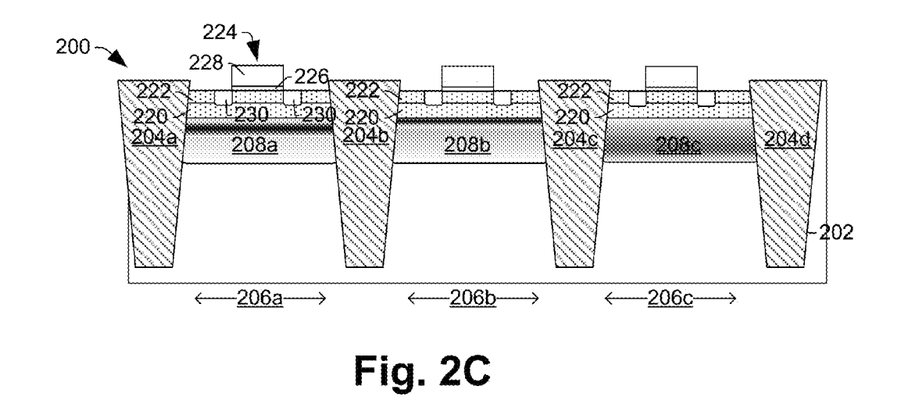

FIGS. 2A-2C illustrate some embodiments of an integrated circuit (IC) workpiece 200 which makes use of implant assisted etching techniques to limit transistor variation. In particular, FIG. 2A illustrates the IC workpiece after selective ion implantation has been performed but prior to an etch, and FIG. 2B illustrates the IC workpiece after the etch has been carried out and after an epitaxial layer has been grown. FIG. 2C shows the IC workpiece after additional device features have been formed. These structures are described in greater detail below.

As shown in FIG. 2A, the IC workpiece 200 includes a semiconductor substrate 202 (e.g., a silicon substrate). A plurality of isolation structures 204 may be disposed within the semiconductor substrate 202 at positions that separate the semiconductor substrate 202 into alternating active regions 206. The illustrated isolation structures 204a-204d are configured to prevent current leakage between adjacent transistor devices in active regions 206a-206c. In some embodiments, the isolation structures 204a-204d comprise shallow trench isolation (STI) structures having a dielectric material disposed within a trench in the semiconductor substrate 202.

In the illustrated implementation, each of the active regions 206 has a well 208, which has a doping profile corresponding to a different type of transistor device. For example, first active region 206a can include a first well region 208a made up of dopants having a first conductivity type (e.g., p-type) at a higher doping concentration. Hence, this first well region 208a facilitates formation of one or more high threshold voltage transistors (e.g., high-$V_T$ NMOS) in the first active region 206a.

Second active region 206b can include a second well region 208b made up of dopants having the first conductivity type (e.g., p-type) at a second doping concentration, which is less than the first doping concentration. Hence, this second well region 208b facilitates formation of one or more low threshold voltage transistors (e.g., low-$V_T$ NMOS). Third active region 206c can include a third well region 208c made up of dopants having the second conductivity type (e.g., n-type). Thus, the third well region 208c can facilitate formation of one or more transistors of the first conductivity type (e.g., PMOS).

Due to the doping differences between the first, second, and third well regions 208a-208c; the first, second, and third well regions 208a-208c as initially formed have different etch rates, as measured from an initial etch surface 214. For example, if the native first, second, and third well regions were etched simultaneously as initially formed, the first well region 208a would be etched as shown by 210a to give way to a first channel recess having a first depth 212a; the second well region 208b would be etched as shown by 210b to give way to a second channel recess having a second depth 212b; and the third well region 208c would be etched as shown by 210c to give way to a third channel recess having a third depth 212c. As mentioned above, these different depth recesses could cause undesired variations in device performance.

Therefore, to mitigate this recess depth variation, selective ion implantation is used to tune the etch rates for sacrificial upper regions of one or more of the wells. Thus, in the illustrated implementation, to increase the etch rate for the high VT NMOS active region 206a, an n-type dopant region can be implanted into a sacrificial upper region 211a of the first p-well 208a. For example, Arsenic impurities can be implanted into the sacrificial region 211a of first p-well 208a to enhance its etching rate, as shown by arrow 213a. Further, to decrease the etch rate for PMOS active region 208c, a p-type dopant can be implanted into a sacrificial upper region 211c of the n-well region 208c. For example, boron impurities can be implanted into the sacrificial upper region 211c of the n-well region 208c to retard its etching rate, as shown by arrow 213c.

In FIG. 2B, the IC workpiece of FIG. 2A has been subjected to an etch process to form recesses 216a-216c. Because of the implantation-tuning that was applied, the recesses 216a-216c have the same depth, such that lower surfaces of the recess lie on a common plane 212b. In some embodiments, this etch completely removes the dopants that were selectively implanted into the sacrificial well regions 211 for tuning purposes. However, in other embodiments some of the selectively implanted dopants are left near upper regions of the well regions.

Epitaxial film stacks 218a, 218b, 218c are formed within the recesses 216a, 216b, 216c. In some embodiments, an epitaxial film stack comprises a carbon doped epitaxial layer 220 disposed within a recess 216. In some embodiments, the epitaxial film stack further comprises an lightly-doped epitaxial layer 222 (e.g., an epitaxial layer grown without doping, but having a low doping concentration due to back diffusion of dopants from the substrate 202) disposed within the recess 216 at a position overlying the carbon doped epitaxial layer 220.

As shown in FIG. 2C, gate structures 224 are disposed onto the semiconductor substrate 200 at a position overlying the lightly-doped epitaxial layer 222. In some embodiments, the gate structure 224 may comprise a stacked gate dielectric layer 226 and a gate electrode layer 228. The gate dielectric layer 226 (e.g., a silicon dioxide layer, a high-k dielectric layer, etc.) is disposed onto the lightly-doped epitaxial layer 222. The gate electrode layer 228 (e.g., a poly-silicon layer, a replacement metal gate layer, etc.) is disposed onto the gate dielectric layer 226. In some embodiments, sidewall spacers (not shown) are located on opposing sides of the gate structure 224. Source/drain regions 230 are then formed about edges of the gate structure 224. Thus, the epitaxial layer 218, which may comprise lightly doped silicon, can act as a channel region between the source/drain regions 230. In some embodiments, the channel region may comprise a first doping type (e.g., a p-type doping for an NMOS transistor). In such embodiments, the source region 230 and the drain region 230 may comprise a second doping type (e.g., an n-type doping).

Figure 3A:
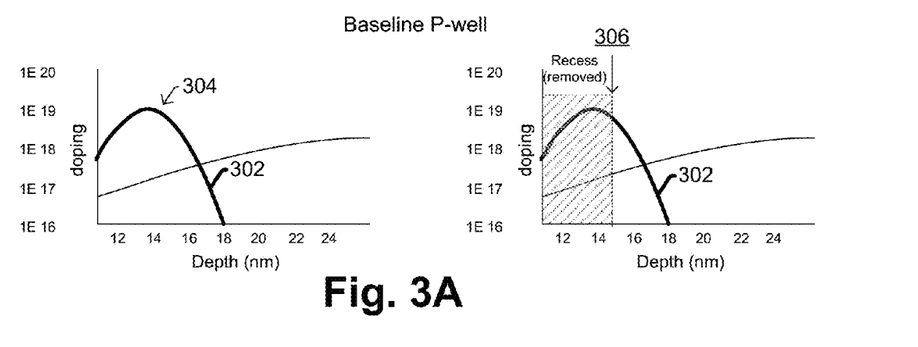
FIGS. 3A-3C illustrate graphs showing doping concentration profiles and corresponding recess depths formed by a predetermined etch process for a channel region of a transistor device.
Figure 3B:
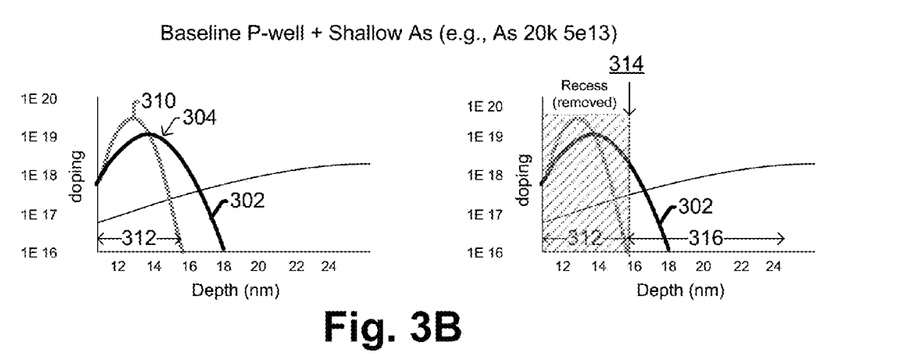
Figure 3C:
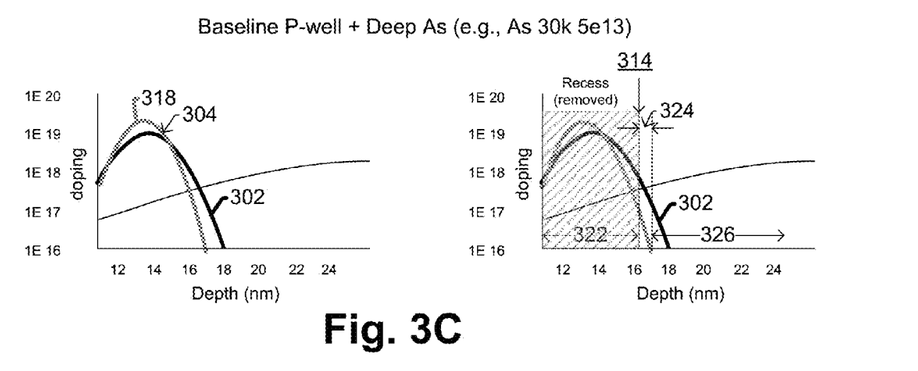

FIGS. 3A-3C illustrate graphs, 300 and 310, showing some embodiments of doping concentration profiles (y-axis) as a function of a depth into a semiconductor substrate (x-axis) (e.g., taken along cross-sectional line as shown in FIG. 2A).

The left-hand graph of FIG. 3A illustrates a p-type doping concentration profile 302 of a p-well as a function of depth. The p-type doping concentration profile 302 follows a Gaussian distribution which has a peak dopant concentration of approximately $1 \times 10^{19}$ impurities/$cm^3$ at a depth of between approximately 12 nm and approximately 15 nm. At a depth of approximately 10 nm the dopant concentration is approximately $1 \times 10^{18}$ impurities/$cm^3$; while at a depth of approximately 18 nm the dopant concentration is $1 \times 10^{16}$ impurities/$cm^3$. As shown in the right-hand graph of FIG. 3A, when the structure of FIG. 3A is subjected to a predetermined etch process, a recess having a depth 306 of between approximately 14 nm and approximately 15 nm is formed.

In the left-hand graph of FIG. 3B, a shallow arsenic dopant implant 310 has been implanted into the p-well 302 of FIG. 3A to enhance the etching rate of the p-well. For example, in some embodiments, arsenic ions can be implanted into solely an upper sacrificial pwell region 312. These ions can be implanted using an energy of approximately 20 keV and a cross-sectional density of approximately $5 \times 10^{13}$ impurities/$cm^2$ to achieve a peak dopant concentration of approximately $2 \times 10^{19}$ impurities/$cm^3$ at a depth of approximately 13 nm. Thus, when FIG. 3B's p-well 302 with its shallow arsenic dopant implant 310 is etched using the same predetermined etch process as used in FIG. 3A, a recess having a total depth 314 of approximately 15 nm to approximately 16 nm is formed, as shown by right-hand portion of FIG. 3B. Notably, in FIG. 3B, the etch is sufficient to remove all of the upper sacrificial pwell region 312 which contains the arsenic dopants, such that the doping profile for the remaining p-well 316 after the etch does not need to be adjusted to account for arsenic dopants.

In the left-hand graph of FIG. 3C, a deep arsenic dopant implant 318 has been implanted into the p-well of FIG. 3A to enhance the etching rate of the p-well. For example, in some embodiments, arsenic ions can be implanted into both an upper sacrificial pwell region 322 as well as a non-sacrificial pwell region 326. In FIG. 3C's example, these ions can be implanted using an energy of approximately 30 keV and a cross-sectional density of approximately $5 \times 10^{13}$ impurities/$cm^2$ to achieve a dopant concentration of approximately slightly less than $2 \times 10^{19}$ impurities/$cm^3$ at a depth of between 13 nm and 14 nm. Thus, when FIG. 3C's p-well with its deep arsenic dopant implant is etched using the same predetermined etch process as used in FIG. 3A, a recess having a depth of approximately 16 nm is formed, as shown by the right-hand portion of FIG. 3C. Notably, as shown in the right-hand portion of FIG. 3C, the etch is sufficient to remove the upper sacrificial pwell region 322, but still leaves both the non-sacrificial p-well region 324 with arsenic atoms and the native pwell region 326 in place. Hence, when the p-well region is initially formed, the doping profile for the p-well ought to take into account these expected arsenic atoms 324 for calculating threshold voltages and other device parameters.

Although FIGS. 3A-3C illustrate some examples of implant-assisted etching where recess depths are selectively increased for a p-well by using arsenic atoms, it will be appreciated that other implant assisted etching techniques also fall within the scope of this disclosure. For example, in the context of n-wells, boron atoms can be used to selectively retard recess depths compared to n-wells without such boron impurities. Other dopants could also be used.

Figure 4:
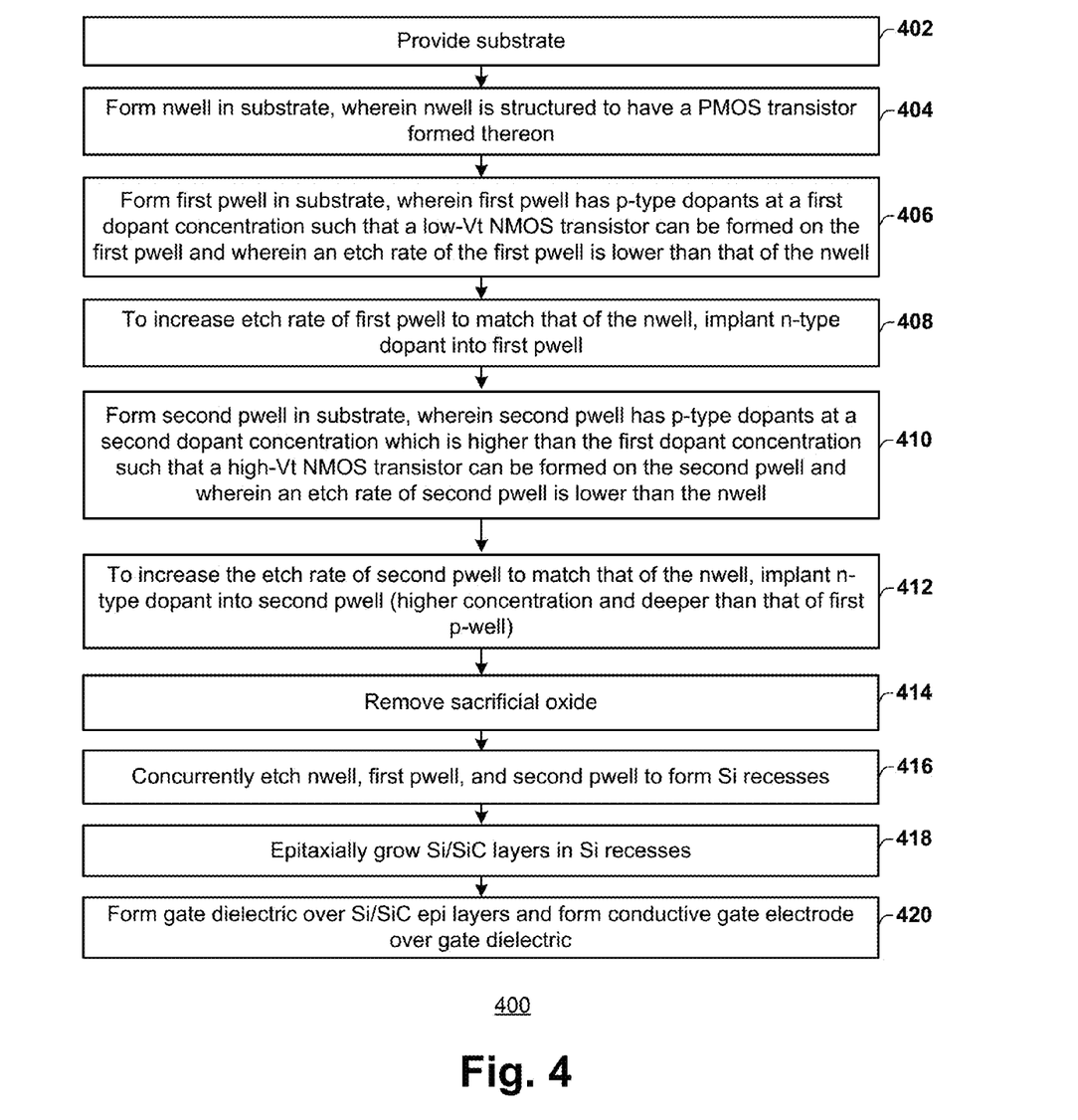
FIG. 4 illustrates a flow diagram of some additional embodiments of a method of forming a transistor device that uses implantation-assisted etching to improve local and global voltage threshold variations.

FIG. 4 illustrates a flow diagram of some additional embodiments of a method 400 of forming a transistor device using implant assisted etching to improve local and global voltage threshold variations. While disclosed methods (e.g., methods 100 and 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a semiconductor substrate is provided. In various embodiments, the semiconductor substrate may comprise any type of semiconductor body (e.g., silicon, silicon-germanium, silicon-on-insulator, etc.) such as a semiconductor wafer and/or one or more die on a semiconductor wafer, as well as any other type of semiconductor and/or epitaxial layers associated therewith.

At 404, an implantation process is performed to introduce n-type dopants into the semiconductor substrate to form an nwell in the substrate. The n-well is structured to have a p-type transistor (e.g., a PMOS transistor) formed thereon. Due to its particular doping characteristics, the nwell has a first etching rate for a predetermined etch procedure.

At 406, an implantation process is performed to introduce p-type dopants into the semiconductor substrate to form a first pwell having a first p-type dopant concentration in the substrate. The first p-well is structured to have a low-$V_t$ n-type transistor (e.g., a low-VT NMOS transistor) formed thereon. The first pwell has a second etching rate, which is less than the first etching rate, for the predetermined etch procedure.

At 408, to increase the etch rate of the first pwell to match that of the nwell, arsenic is implanted into the first pwell at a first predetermined concentration. In some embodiments, the arsenic can be implanted shallowly so it resides solely in a sacrificial region of the first pwell that will be entirely removed during etching. In other embodiments, the arsenic can be implanted deeper so it resides in both a sacrificial region of the first pwell to be entirely removed during etching as well as a non-sacrificial region of the first pwell that will remain in place after the etching.

At 410, an implantation process is performed to introduce p-type dopants into the semiconductor substrate to form a second pwell having a second p-type dopant concentration that is greater than the first p-type dopant concentration. The second p-well is structured to have a high-$V_t$ n-type transistor (e.g., a high-VT NMOS transistor) formed thereon. Due to its doping characteristics, the second pwell has a third etching rate, which is less than the second etching rate, for the predetermined etch procedure.

At 412, to increase the etch rate of the second pwell to match that of the nwell and tuned first pwell, arsenic is implanted into the second pwell at a second predetermined concentration, which is greater than the first predetermined concentration. In some embodiments, the arsenic can be implanted more deeply than for the tuned pwell to help enhance etching.

Although not expressly illustrated in FIG. 4, an anneal operation can be carried out after 412 to repair any damage due to the ion implantation and to activate the implanted dopant impurities. The anneal operation can also be carried out in separate acts after formation of each nwell and each pwell in other implementations.

In 414, a sacrificial oxide layer is removed from upper regions of the nwell and pwell structures. This can be removed, for example, by wet etching or by reactive ion etching, for example.

In 416, the nwell, first pwell and second pwell are concurrently etched to form recesses in the substrate. Because of the implantation-assisted techniques used, the recesses have uniform depths. To further help with gate height variation and to maintain super steep channel doping profiles, the recess can be less than 18 nm in height in some embodiments.

At 418 Si or SiC epitaxial layers are grown in the Si recesses. These Si or SiC epitaxial layers act as a channel region for transistors to be formed.

In 420, a gate dielectric and conductive gate electrode are formed over the Si/SiC epi layers. Other device features, such as source/drain regions on opposite sides of the gate electrode, contacts, and the like, are then formed.

FIGS. 5-12 illustrate some embodiments of cross-sectional views of a semiconductor substrate showing a method of forming a transistor device. In particular, FIGS. 5-12 show an example where an etch enhancer in the form of arsenic, for example, enhances the etch rate for pwell regions. Although FIGS. 5-12 are described in relation to method 400, it will be appreciated that the structures disclosed in FIGS. 5-12 are not limited to such a method.

Figure 5:
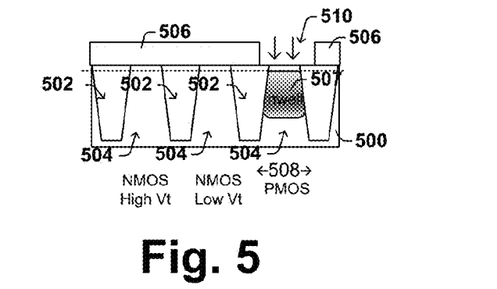
FIGS. 5-12 illustrate cross-sectional views of some embodiments of a method of forming a transistor device using implantation-assisted etching, wherein an etch enhancer in the form of arsenic is used for selectively increasing an etch rate of pwell regions.

FIG. 5 illustrates a cross-sectional view 500 of some embodiments of a semiconductor substrate 500 corresponding to acts 402-420. The substrate 500 includes a plurality of isolation structures 502, which may be at positions that separate the semiconductor substrate 500 into alternating active regions 504. An nwell mask 506 is formed over some active regions while leaving other active regions exposed (here PMOS region 508 is exposed). With the nwell mask 506 in place, a voltage threshold ($V_t$)/nwell implant 510 is performed on the semiconductor substrate 500. The $V_t$/well implant 510 is configured to introduce n-type dopants into the semiconductor substrate 500 to adjust the $V_t$ (threshold voltage) applied to a transistor to allow current to flow in a channel region. In some embodiments, the $V_t$/nwell implant 510 may introduce an n-type dopant (e.g., phosphorous, antimony, or arsenic) into the semiconductor substrate 500. In various embodiments, the $V_t$/nwell implant 510 may use an implant energy of between approximately 10 keV (electron volts) and approximately 1000 keV.

Figure 6:
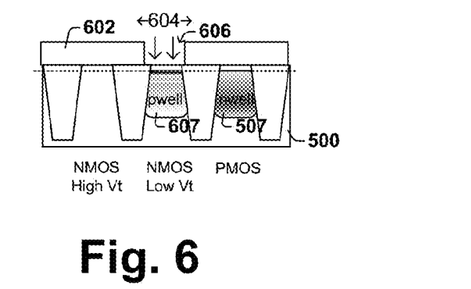

As shown in FIG. 6, a first pwell mask 602 is formed over some active regions while leaving other active regions exposed (here low-Vt NMOS region 604 is exposed). With the first pwell mask 602 in place, a voltage threshold ($V_t$)/first pwell implant 606 is performed on the semiconductor substrate 500. The $V_t$/first pwell implant 606 is configured to introduce p-type dopants into the semiconductor substrate 500 to adjust the $V_t$ (threshold voltage) applied to a transistor to allow current to flow in a channel region. In various embodiments, the $V_t$/first pwell implant 606 may use an implant energy of between approximately 10 keV (electron volts) and approximately 1000 keV.

Figure 7:
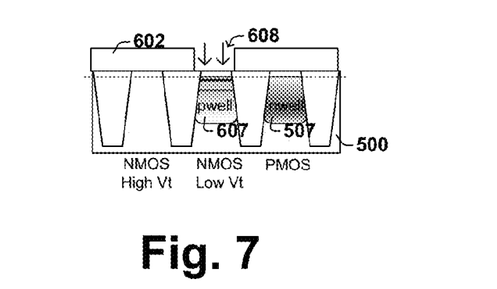

As shown in FIG. 7, because the first pwell may initially have a different etching rate relative to nwell, an etch enhancement implant may be carried out with the first pwell mask 602 in place. This etch enhancement implant 608, such as Arsenic, can be implanted at a dosage sufficient to bring the etching rate of the first pwell 607 in line with that of the nwell 507.

Figure 8:
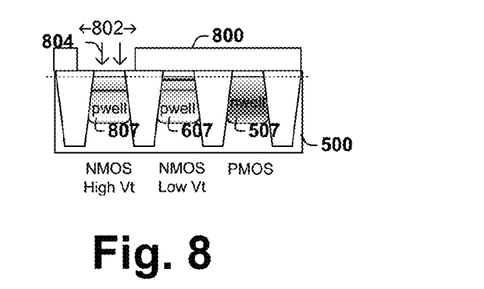

In FIG. 8, a second pwell mask 800 is formed over some active regions while leaving other active regions exposed (here high-Vt NMOS region 802 is exposed). With the second pwell mask 800 in place, a voltage threshold ($V_t$)/second pwell implantation 804 is performed on the semiconductor substrate 500. The $V_t$/second pwell implant 804 is configured to introduce p-type dopants into the semiconductor substrate 500 to adjust the $V_t$ (threshold voltage) applied to a transistor to allow current to flow in a channel region. In various embodiments, the $V_t$/second pwell implantation 804 may use an implant energy of between approximately 10 keV (electron volts) and approximately 1000 k eV.

Figure 9:
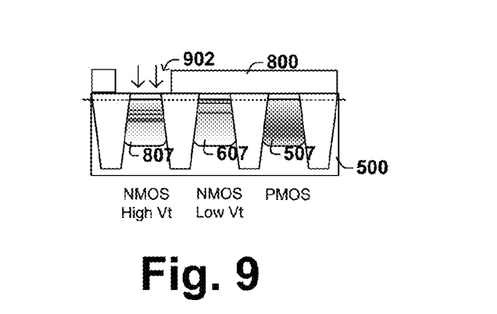

As shown in FIG. 9, because the second pwell 807 may initially have a different etching rate relative to nwell 507 and/or pwell 607, an etch enhancement implant 902 may be carried out with the second pwell mask 800 in place. This etch enhancement implant 902, such as arsenic, can be implanted at a dosage sufficient to bring the etching rate of the second pwell 807 in line with that of the nwell 507 and/or first pwell 607.

Although not shown, a well anneal process is performed to activate the implanted dopants introduced by the $V_t$/well implantations. The well anneal process is performed by exposing the semiconductor substrate 504 to an elevated temperature (e.g., greater than or equal to 400° C.). The well anneal process may also cure crystalline defects and/or cause diffusion and redistribution of dopant impurities to drive the implanted dopants deeper into the semiconductor substrate.

Figure 10:
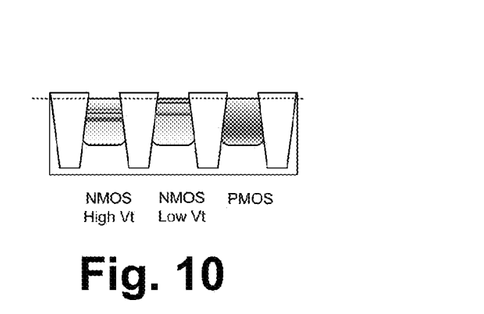

In FIG. 10, after the anneal process, a sacrificial oxide is removed from over each of the well regions.

Figure 11:
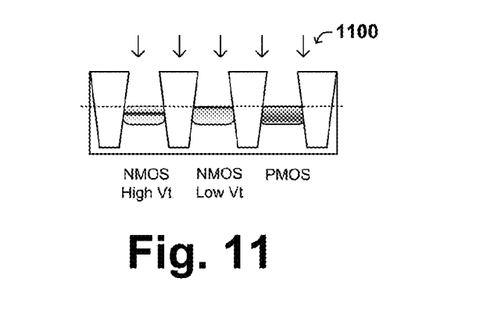

In FIG. 11, a predetermined etch 1100 is carried out to concurrently etch the nwell region 507, the first pwell region 607 and the second pwell region 807. In some embodiments, the etch 1100 may be configured to remove a predetermined thickness of a portion of the semiconductor substrate 500 that is between approximately 5 nm and approximately 20 nm, for example. In some embodiments, the etchant 1100 may comprise a combination of a dry etchant (e.g., an ion bombardment) and a wet etchant (e.g., Tetramethylammonium hydroxide (TMAH), potassium hydroxide (KOH), etc.).

Figure 12:
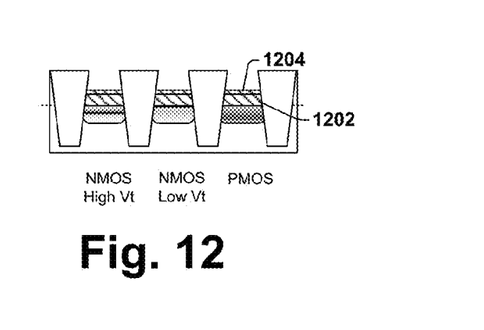

As shown in FIG. 12, a silicon carbide (SiC) layer 1202 is epitaxially grown within the recess. In some embodiments, the SiC layer 1202 may be epitaxially grown to a thickness having a range of between approximately 2 nm and approximately 20 nm. The silicon carbide (SiC) layer 1202 is undoped. An un-doped silicon layer 1204 is epitaxially grown within the recess at a position overlying the SiC layer 1202. The un-doped silicon layer 1204 may be epitaxially grown to a thickness of between approximately 5 nm and approximately 20 nm.

FIGS. 13-20 illustrate some embodiments of cross-sectional views of a semiconductor substrate showing a method of forming a transistor device. In particular, FIGS. 13-20 show an example where an etch retarder in the form of boron, for example, decreases the etch rate for nwell regions. Although FIGS. 13-20 are described in relation to method 400, it will be appreciated that the structures disclosed in FIGS. 13-20 are not limited to such a method.

Figure 13:
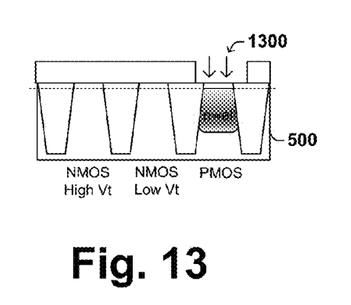
FIGS. 13-20 illustrate cross-sectional views of some embodiments of a method of forming a transistor device using implantation-assisted etching, wherein an etch retarder in the form of boron is used for selectively DECREASING an etch rate of nwell regions.

FIG. 13 illustrates a cross-sectional view of some embodiments of a semiconductor substrate 500. A plurality of isolation structures may be disposed within the semiconductor substrate at positions that separate the semiconductor substrate 202 into alternating active regions. An nwell mask is formed over some active regions while leaving other active regions exposed (here PMOS region is exposed). With the nwell mask in place, a voltage threshold ($V_t$)/nwell implant 1300 is performed on the semiconductor substrate. The $V_t$/well implant 1300 is configured to introduce n-type dopants into the semiconductor substrate to adjust the $V_t$ (threshold voltage) applied to a transistor to allow current to flow in a channel region. In some embodiments, the $V_t$/nwell implant 1300 may introduce an n-type dopant (e.g., phosphorous, antimony, or arsenic) into the semiconductor substrate. In various embodiments, the $V_t$/nwell implantation may use an implant energy of between approximately 10 keV (electron volts) and approximately 1000 keV.

Figure 14:
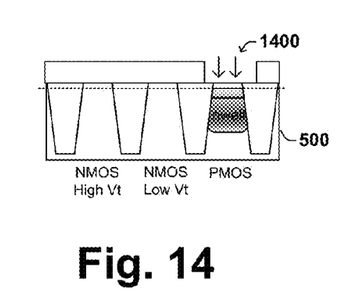

Because the nwell is expected to have a relatively large etch rate compared to the pwell regions, FIG. 14 shows implantation 1400 of a p-type dopant, such as boron, into the nwell. This p-type dopant is implanted at a concentration that is expected to match the etch rate of the nwell to that of pwell regions in the substrate after tuning.

Figure 15:
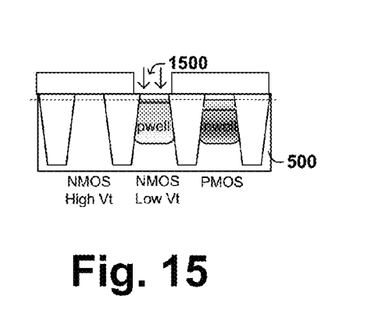

As shown in FIG. 15, a first pwell mask is formed over some active regions while leaving other active regions exposed (here low-Vt NMOS region is exposed). With the first pwell mask in place, a voltage threshold ($V_t$)/first pwell implantation 1500 is performed on the semiconductor substrate. The $V_t$/first pwell implantation 1500 is configured to introduce p-type dopants into the semiconductor substrate to adjust the $V_t$ (threshold voltage) applied to a transistor to allow current to flow in a channel region. In various embodiments, the $V_t$/first pwell implantation 1500 may use an implant energy of between approximately 10 keV (electron volts) and approximately 1000 keV.

Figure 16:
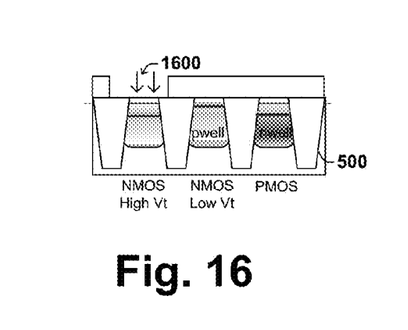

In FIG. 16, a second pwell mask is formed over some active regions while leaving other active regions exposed (here high-Vt NMOS region is exposed). With the second pwell mask in place, a voltage threshold ($V_t$)/second pwell implantation 1600 is performed on the semiconductor substrate. The $V_t$/second pwell implantation 1600 is configured to introduce p-type dopants into the semiconductor substrate to adjust the $V_t$ (threshold voltage) applied to a transistor to allow current to flow in a channel region. In various embodiments, the $V_t$/second pwell implantation 1600 may use an implant energy of between approximately 10 keV (electron volts) and approximately 1000 keV.

Figure 17:
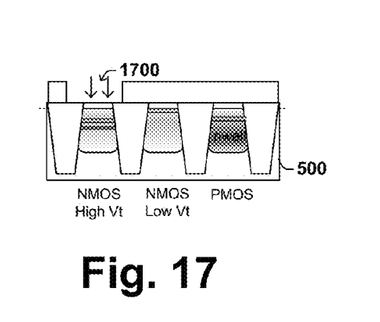

As shown in FIG. 17, because the second pwell may initially have a slower etching rate relative to the first pwell, an etch enhancement implant 1700 may be carried out with the second pwell mask in place. This etch enhancement implant 1700, such as arsenic, can be implanted at a dosage sufficient to bring the etching rate of the second pwell in line with that of the first pwell.

Although not shown, a well anneal process is performed to activate the implanted dopants introduce by the $V_t$/well implantations. The well anneal process is performed by exposing the semiconductor substrate 504 to an elevated temperature (e.g., greater than or equal to 400° C.). The well anneal process may also cure crystalline defects and/or cause diffusion and redistribution of dopant impurities to drive the implanted dopants deeper into the semiconductor substrate.

Figure 18:
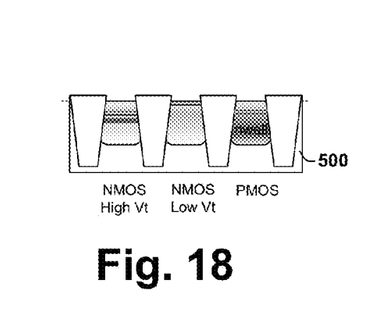

In FIG. 18, a sacrificial oxide is removed from over each of the well regions.

Figure 19:
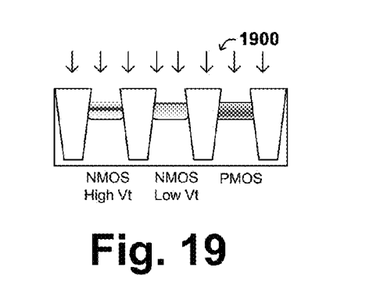

In FIG. 19, a predetermined etch 1900 is carried out to concurrently etch the nwell region, the first pwell region and the second pwell region. In some embodiments, the etch 702 may be configured to remove a thickness of a portion of the semiconductor substrate that is between approximately 5 nm and approximately 20 nm, for example. In some embodiments, the etchant 1900 may comprise a combination of a dry etchant (e.g., an ion bombardment) and a wet etchant (e.g., Tetramethylammonium hydroxide (TMAH), potassium hydroxide (KOH), etc.).

Figure 20:
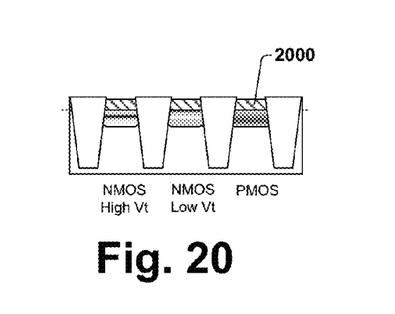

As shown in FIG. 20, one or more epitaxial layers 2000, such as a silicon carbide (SiC) layer and an un-doped silicon layer are epitaxially grown within the recess.

Figure 21:
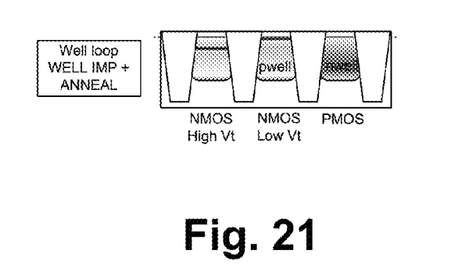
FIGS. 21-25 illustrate cross-sectional views of some embodiments of a method of forming a transistor device using implantation-assisted etching, wherein a blanket implant is used to alter the etch rates of well regions.

FIGS. 21-25 show an alternative process flow whereby a blanket implant is used to tune the etch rates of the well regions. Thus, FIG. 21 shows a first pwell region in which a high-VT NMOS device is to be formed, a second pwell region in which a low-VT NMOS device is to be formed, and an n-well region in which a PMOS device is to be formed.

Figure 22:
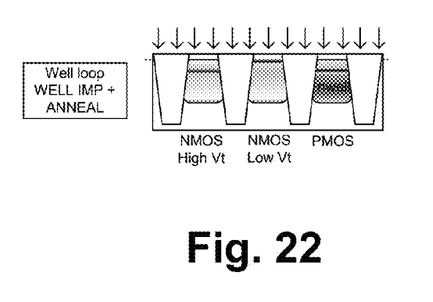

In FIG. 22, a blanket implant is provided. In some embodiments, the blanket implant is a pwell etch-enhancing implant, such as an arsenic implant, to enhance the recess etch for the p-well regions. In other embodiments, the blanket implant is an nwell etch-retarding implant, such as a $BF_2$, C, or boron, implant, to retard the recess etch for the n-well region.

Figure 23:
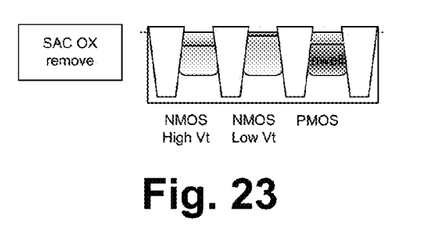
Figure 24:
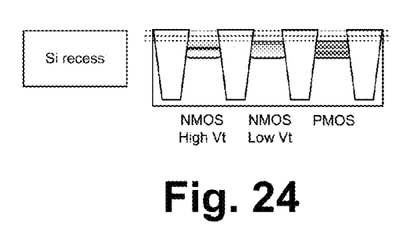
Figure 25:
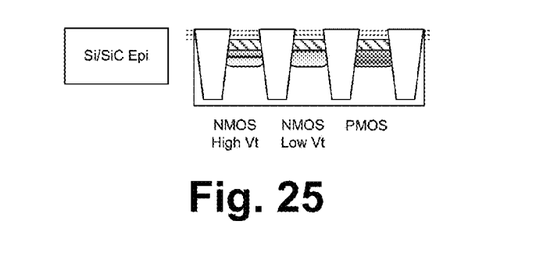

In FIG. 23, after the blanket implant is provided, the sacrificial oxide is removed. In FIG. 24, the nwell and pwell regions are simultaneously etched to form recesses having a uniform recess depth in the substrate. In FIG. 25, a silicon carbide (SiC) layer is epitaxially grown within the recess, and an un-doped silicon layer is epitaxially grown within the recess at a position overlying the SiC layer.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to a method of forming a transistor device having a carbon implantation region configured to provide for a low variation of voltage threshold. In particular, "implant tuned" etch procedures are used to reduce variations in recess depths, and thereby subsequently grown epitaxial films formed in the recesses can have more uniform heights than previously achievable. This more uniform height provides more uniform transistor operation performance than previously achievable. For example, these techniques can provide more uniform threshold voltages for transistors over a wafer, as well as providing improved device speeds for typical transistors on the wafer.

Some embodiments of the present disclosure relate to a method of forming a transistor device. In this method, first and second well regions are formed within a semiconductor substrate. The first and second well regions have first and second etch rates, respectively, which are different from one another. Dopants are selectively implanted into the first well region to alter the first etch rate to make the first etch rate substantially equal to the second etch rate. The first, selectively implanted well region and the second well region are etched to form channel recesses having equal recess depths. An epitaxial growth process is performed to form one or more epitaxial layers within the channel recesses.

In other embodiments, the present disclosure relates to a method of forming a transistor device. In this method, a first well region is formed in a substrate. A second well region is also formed in the substrate. The second well region has a doping characteristic that differs from that of the first well region. Dopants are implanted into a sacrificial region of the first well region to alter an etch rate of the sacrificial region of the first well. The first, selectively implanted well region and the second well region are concurrently etched to remove the sacrificial region of the first well region and to concurrently remove a region of the second well region having a same height as the sacrificial region to form channel recesses in the first and second well regions having equal recess depths.

Yet other embodiments relate to a method of forming a transistor device. A first pwell region is formed in a substrate. A second well region is also formed in the substrate. The second well region has a doping characteristic that differs from that of the first pwell region. Etch enhancing dopants are implanted into a sacrificial region of the first pwell region to increase an etch rate of the sacrificial region of the first pwell for a predetermined etch procedure. Both the sacrificial region of the first pwell region and the second well region are concurrently etched with the predetermined etch procedure to remove the sacrificial region of the first pwell region and to concurrently remove a region of the second well region having a same height as the sacrificial region to form channel recesses in the first and second well regions having equal recess depths.

What is claimed is:

1. A method of forming a transistor device, comprising:
   forming first and second well regions within a semiconductor substrate, the first and second well regions having first and second etch rates, respectively, which are different from one another for a pre-determined etch;
   selectively implanting dopants into the first well region to alter the first etch rate to make the first etch rate substantially equal to the second etch rate; and
   concurrently etching both the first, selectively implanted well region and the second well region using the pre-determined etch to form channel recesses having equal recess depths.

2. The method of claim 1, wherein the first well region has a first doping conductivity type and the second well region has a second doping conductivity type opposite the first doping conductivity type.

3. The method of claim 2, wherein the first well region is a p-well region and the dopants which are selectively implanted into the first well region comprise an n-type species to enhance the first etch rate.

4. The method of claim 2, wherein the first well region is a n-well region and the dopants which are selectively implanted into the first well region comprise a p-type species to retard the first etch rate.

5. The method of claim 1, wherein the first well region is an n-well region having a first doping concentration, and the second well region is an n-well region having a second doping concentration that differs from the first doping concentration.

6. The method of claim 5, wherein the dopant that is selectively implanted into the first well region is arsenic and enhances the first etch rate.

7. The method of claim 1, further comprising:
   performing an epitaxial growth process to form one or more epitaxial layers within the channel recesses; wherein the one or more epitaxial layers comprise a carbon doped silicon epitaxial layer and an un-doped silicon epitaxial layer.

8. The method of claim 7, further comprising:
   forming a gate structure onto the un-doped silicon epitaxial layer, wherein the gate structure comprises a gate dielectric layer disposed onto the un-doped silicon epitaxial layer and a gate electrode layer disposed onto the gate dielectric layer.

9. The method of claim 8, further comprising:
   forming a source region and a drain region on opposing sides of the gate structure, such that a channel region comprising the one or more epitaxial layers, which is arranged under the gate structure, separates the source region from the drain region.

10. The method of claim 1, wherein the selective implantation of dopants is performed with an implantation energy that is less than 50 kiloelectron volts (keV).

11. The method of claim 1, further comprising:
   forming a third well region within the semiconductor substrate, wherein the third well region has a doping conductivity type that is the same as one of the first and second well regions, and has a third etch rate which differs from the first and second etch rates for the pre-determined etch;
   implanting dopants into the third well region to alter the third etch rate to make the third etch rate substantially equal to the first and second etch rates; and
   concurrently etching the first, selectively implanted well region, the second well region, and the third implanted well region using the pre-determined etch to form first, second, and third channel recesses having equal recess depths.

12. A method of forming a transistor device, comprising:
forming a first well region in a substrate, the first well region having a first etch rate for a predetermined etch;
forming a second well region in the substrate, the second well region having a doping characteristic that differs from that of the first well region and having a second etch rate that differs from the first etch rate for the predetermined etch;
implanting dopants into a sacrificial region of the first well region to alter the first etch rate for the sacrificial region of the first well; and
concurrently etching both the first, selectively implanted well region and the second well region to remove the sacrificial region of the first well region and to concurrently remove a region of the second well region having a same height as the sacrificial region to form channel recesses in the first and second well regions having equal recess depths.

13. The method of claim 12, further comprising:
performing an epitaxial growth process to form one or more epitaxial layers having equal respective heights within the channel recesses.

14. The method of claim 12, wherein concurrently etching the first and second well regions completely removes the selectively implanted dopants from the first well region.

15. The method of claim 12, wherein the first well region has a first doping type and the second well region has a second, opposite doping type.

16. The method of claim 12, wherein the first well region has a first doping type at a first doping concentration and the second well region has the first doping type at a second doping concentration that differs from the first doping concentration.

17. The method of claim 12, wherein the dopants are selectively implanted through an opening in a mask into the first well while being blocked from entering the second well by the mask.

18. The method of claim 12, further comprising:
forming a third well region within the semiconductor substrate, wherein the third well region has a doping conductivity type that is the same as one of the first and second well regions, and has a third etch rate which differs from the first and second etch rates for the predetermined etch;
implanting dopants into the third well region to alter the third etch rate to make the third etch rate substantially equal to the first and second etch rates; and
concurrently etching the first selectively implanted well region, the second well region, and the third implanted well region using the pre-determined etch to form first, second, and third channel recesses having equal recess depths.

19. A method of forming a transistor device, comprising:
forming a first pwell region in a substrate, the first pwell region having a first etching rate for a predetermined etch procedure;
forming a second well region in the substrate, the second well region having a doping characteristic that differs from that of the first pwell region and having a second etching rate for the predetermined etch procedure;
implanting etch enhancing dopants into a sacrificial region of the first pwell region to increase an etch rate of the sacrificial region of the first pwell for a predetermined etch procedure; and
concurrently etching both the sacrificial region of the first pwell region and the second well region with the predetermined etch procedure to remove the sacrificial region of the first pwell region and to concurrently remove a region of the second well region having a same height as the sacrificial region to form channel recesses in the first and second well regions having equal recess depths.

20. The method of claim 19, further comprising:
forming a third well region within the semiconductor substrate, wherein the third well region has a doping conductivity type that is the same as one of the first pwell region and the second well region, and has a third etch rate which differs from the first and second etch rates for the predetermined etch;
implanting dopants into the third well region to alter the third etch rate to make the third etch rate substantially equal to the first and second etch rates; and
concurrently etching sacrificial region of the first pwell region, the second well region, and the third implanted well region using the pre-determined etch to form first, second, and third channel recesses having equal recess depths.

* * * * *